(12) United States Patent
Goodfriend et al.

(10) Patent No.: US 11,801,704 B2
(45) Date of Patent: Oct. 31, 2023

(54) METHOD AND A DEVICE FOR ASSEMBLY OF A NANOMATERIAL STRUCTURE

(71) Applicant: Fyzikální ústav AV ČR, v. v. i., Prague (CZ)

(72) Inventors: Nathan Goodfriend, Prague (CZ); Alexander Bulgakov, Prague (CZ)

(73) Assignee: Fyzikální ústav AV CR, v.v.i., Prague (CZ)

( * ) Notice: Subject to any disclaimer, the term of this patent is extended or adjusted under 35 U.S.C. 154(b) by 0 days.

(21) Appl. No.: 17/549,911

(22) Filed: Dec. 14, 2021

(65) Prior Publication Data

US 2022/0194111 A1  Jun. 23, 2022

(30) Foreign Application Priority Data

Dec. 17, 2020  (LU) .......................... 102294

(51) Int. Cl.
| | |
|---|---|
| *B41M 5/46* | (2006.01) |
| *G01N 21/64* | (2006.01) |
| *B82Y 40/00* | (2011.01) |

(52) U.S. Cl.
CPC .......... *B41M 5/46* (2013.01); *G01N 21/6456* (2013.01); *B41M 2205/08* (2013.01); *B82Y 40/00* (2013.01)

(58) Field of Classification Search
CPC ........ C23C 14/22; C23C 14/28; B41M 5/395; B41M 5/46; B41M 5/38221; B41M 5/24
See application file for complete search history.

(56) References Cited

U.S. PATENT DOCUMENTS

| | | | |
|---|---|---|---|
| 6,835,426 B2 * | 12/2004 | Duignan .............. | C23C 14/048 219/121.81 |
| 2005/0191448 A1 | 9/2005 | Suh et al. | |
| 2009/0130427 A1 | 5/2009 | Grigoropoulos et al. | |
| 2018/0110127 A1 | 4/2018 | Alloncle et al. | |
| 2019/0019736 A1 * | 1/2019 | Schrauben ........ | H01L 23/49827 |

OTHER PUBLICATIONS

The University of Edinburgh, Goodfriend et al., "Blister-based laser induced forward transfer: a non-contact, dry laser-based transfer method for nanomaterials," pp. 1-25, Jul. 2018, United Kingdom.

* cited by examiner

*Primary Examiner* — Michael P Wieczorek
(74) *Attorney, Agent, or Firm* — Tatonetti IP

(57) ABSTRACT

The present invention relates to a method and device capable to form a nanomaterial structure (13) on a receiver (14) by transfer of nanomaterial from a donor film. In some embodiment, the transfer can be provided by laser induced forward transfer, more preferably by blister based laser induced forward transfer. The method further comprises a simultaneous scanning of the donor film (12) or the receiver (14) so that, a computer driven means for moving the receiver (14) and the donor film (12) can form high precision nanomaterial structure (13). In a preferred embodiment, the simultaneous scanning can be provided by an imaging laser generating high harmonic waves which are detected by a detector. In yet another embodiment, the receiver (14) and/or donor film (12) can be further scanned by a broadband light source(s). In a preferred embodiment, imaging laser and/or light source(s) are emitting polarized light to determine orientation of the nanoparticle deposited on the receiver (14) and forming the nanomaterial structure (13).

7 Claims, 6 Drawing Sheets

METHOD AND A DEVICE FOR ASSEMBLY OF A NANOMATERIAL STRUCTURE

TECHNICAL FIELD

The present invention relates to a device and a method for manufacturing of a structured atomic scale layer. In particular, the present invention concerns a method, resp. device, for deposition or transfer of nanomaterial, preferably using a blister based laser induced forward transfer process. In the preferred embodiment, the invention relates to the transfer of material using a laser induced forward transfer process wherein the nanomaterial is deposited on a receiver, thereby forming a pattern of two-dimensional materials.

PRIOR ART

Transfer of nanomaterial from a donor film to a receiver layer is discussed in several publications. A non-patent literature Goodfriend N T, Heng S Y, Nerushev O A, et al. Blister-based-laser-induced-forward-transfer: a non-contact, dry laser-based transfer method for nanomaterials. Nanotechnology. 2018; 29(38):385301. doi:10.1088/1361-6528/aaceda discloses a method and a device for production of pattern of nanomaterial. The method comprises the steps:
  providing a sample; wherein the sample comprises a transparent substrate, which can be a glass layer; and wherein an opaque metal layer is deposited on the transparent substrate;
  providing a receiver layer configured so that, it is capable to receive a two-dimensional (hereinafter referred as 2D) nanomaterial transported from opaque layer deposited on the transparent layer; and
  providing a pulsed laser configured to create a metal blister from glass layer and thus to eject the deposited 2D nanomaterial and to transmit thereof to the receiver layer.

This technology does not incorporate targeting or orientation measurement and control. The movement of the donor and receiver are locked to each other disabling stacked layers. The experiment took place under vacuum, and this technology is designed for ambient or controlled atmospheres (noble gases or low pressure).

There also exists patent documents disclosing transfer of nanoparticles from a donor film to a receiver layer using laser induced forward transfer processes. US2005191448A1 discloses a method of manufacturing a thin film transistor using the donor sheet where the active layers are made out of nanoparticles. The nanoparticles can be applied to a substrate from a donor sheet. The donor sheet includes a base film, and a transfer layer being disposed at one side of the base film and being transferable to another object like a substrate, the transfer layer having nanoparticles formed thereon and in parallel with each other. The substrate may be formed of glass. Material of nanoparticles can be Ti. N-type Si nanowires are made by laser-assisted catalytic growth (LCG). Simply, the N-type Si nanowires are composed by ablating a gold target using a laser beam of Nd:YAG laser (532 nm; pulse width of 8 ns, 300 mJ/pulse, 10 Hz).

US2009130427 relates to the deposition or transfer of material using a laser induced forward transfer process. More specifically, the invention relates to the transfer of material using a laser induced forward transfer process wherein the transfer process is facilitated by one or more nanomaterials. The energy source is typically a laser or other radiation source producing adequate energy delivery to the material to be transferred. As noted above, the energy source can be a pulsed or continuous wave laser, or other sources of light or electromagnetic radiation delivering adequate energy to the material to be transferred. The laser beam can thus be directed onto the first face of the donor substrate and may pass through the donor substrate without losing a significant amount of energy, that is, with the delivery to the imaging face of sufficient laser light energy so as to perform the desired material transfer at the imaging face. The laser light is typically absorbed at or near the imaging face of the donor substrate, at or near the material to be transferred (or "material of interest"). An acceptor substrate is typically placed in close proximity to the donor substrate having a face of the acceptor substrate (the "first face") onto which transfer of material is desired, placed across from and in close proximity with the imaging face of the donor substrate.

US2009130427 relates to the deposition or transfer of material using a laser induced forward transfer process. More specifically, the invention relates to the transfer of material using a laser induced forward transfer process wherein the transfer process is facilitated by one or more nanomaterials. The energy source is typically a laser or other radiation source producing adequate energy delivery to the material to be transferred. As noted above, the energy source can be a pulsed or continuous wave laser, or other sources of light or electromagnetic radiation delivering adequate energy to the material to be transferred. The laser beam can thus be directed onto the first face of the donor substrate and may pass through the donor substrate without losing a significant amount of energy, that is, with the delivery to the second face of sufficient laser light energy so as to perform the desired material transfer at the second face. The laser light is typically absorbed at or near the second face of the donor substrate, at or near the material to be transferred (or "material of interest"). An acceptor substrate is typically placed in close proximity to the donor substrate having a face of the acceptor substrate (the "first face") onto which transfer of material is desired, placed across from and in close proximity with the second face of the donor substrate.

US2018110127 relates to the field of printing techniques for electronics and more particularly to a laser printing method. Printing method includes the following steps:
  the provision of a receiver substrate;
  the provision of a target substrate comprising a transparent substrate one surface of which has a coating constituted of a solid metal film;
  localized irradiation of the said film through the said transparent substrate by means of a first laser in order to reach the melting temperature of the metal in a target zone of the said film which is in liquid form;
  irradiation of the said liquid film through the said transparent substrate by means of a imaging laser on the said target zone, in order to form a liquid jet in the said target zone and bring about the ejection thereof from the substrate in the form of molten metal;
  depositing on the receiver substrate of a molten metal drop over a defined receiving zone, with the said drop solidifying upon cooling. The invention according to US2018110127 is not capable to provide blister actuated laser induced forward transfer.

An optical scanner is used for controlling the movement of both laser beams. However, the quality of the receiver layer is unknown.

In some industrial application, the above-mentioned invention can be used for accurately direct write sub-micron features sizes at specific addressable locations, such as disclosed in WO2012066338. In order to provide an optical medium for performing direct writing, the medium comprises:
- a substrate layer being grooved;
- a reflective layer provided on the substrate layer; and a donor substrate including:
- a substrate layer;
- an ablative layer provided on the substrate layer; and a transfer layer, wherein:
- the optical medium comprises tracking and addressing means arranged to allow an optical drive to determine the position of a read/write laser on the medium; and
- the optical medium is arranged such that a portion of the transfer layer is transferred from the donor substrate to the acceptor substrate when the ablative layer is ablated by a beam of laser light, wherein the location of the beam of light can be determined using the tracking an addressing means. The main drawback of the solution according to WO2012066338 is to use the reflective layer on the substrate.

Said tracking and addressing means serves for tracking binary information and is based on grooves formed in the optical medium and empty or filled gap therein.

In view of the prior art, the technical problem to be solved by the present invention relates to a method capable to produce at least 2-dimensional nanomaterial structure, wherein the nanomaterial can be oriented and positioned on a particular spot.

SUMMARY OF THE INVENTION

In a first aspect of the present invention, a method for production of a nanomaterial structure is disclosed. In some aspect, the nanomaterial structure can form a layer from metal nanoparticles, liquid droplets, ink containing nanoparticles or biological materials. The nanomaterial structure can form, from the point of view its geometry, any pattern such as isolated dots, rectangular pattern, line, pyramid or array of single points pattern. Furthermore, due to variable positioning of the receiver and/or plate comprising a donor film, a 3D structure can be provided by means of transferring plurality of nanoparticles to the same spot on the receiver.

The method for production of a nanomaterial structure comprises the steps:
- providing a plate having a transparent layer and a sacrificial layer positioned on the transparent layer; and a donor film deposited on the sacrificial layer;
- irradiation of the sacrificial layer through the transparent layer by an irradiation beam so that a part of the donor film is transferred from the plate and received by the receiver; wherein
- the receiver and/or the plate moving so that the receiver is receiving at least a part of the donor film at pre-defined spot; and wherein
- the method comprises simultaneous scanning of the receiver and/or the donor film.

The above-defined method provides creation of structure made of nanomaterial formed on the receiver. Due to the movement of the receiver or the plate, it is possible to transfer a part of the nanomaterial from the donor film and locate it to desired position. Simultaneous scanning helps to locate and adjust orientation of the nanoparticles during irradiation process of the donor film. The donor film and/or receiver can be scanned while the plate is mounted on a stage capable of xyz move or rotation or tilt. The stage moves the nanomaterial of the donor film across the focus of the objective. When properly aligned, the center of focus will be directed to a spot where ejection irradiation, e.g. laser pulse, is centered. The irradiation beam can be any shape and/or temporal and special profile selected for appropriate material ejection profile. Thus ejection of the nanomaterial is targeted by scanning across the donor film with the stage to find the nanomaterial to transfer. It is possible to adjust the polarisation of the imaging laser (which has helped you find the thickness of the films) and re-orient the target to the specific angle requested. It is also possible to scan across the receiver with the XYZ and/or rotation stages to find the position you wish to transfer the material to and adjust its orientation according to request. The movement by the stage further helps to align the target material and the target location and fire an ejection pulse. Scan across the receiver by a movable stage helps to find the position to transfer the material to and adjust its orientation according to request. The target material and the target location and fire an ejection pulse are aligned.

Hereinafter, nanomaterials are referred as material comprised of assemblies of nanoparticles, thin films of less than about 1 μm in thickness, more preferably less than 100 nm in thickness, wherein the dimensions of less than about 1 μm, preferably less than 100 nm, is in at least one direction. In more preferred embodiment, the dimension of nanoparticles are less than 0.3 nm which corresponds to the atomic scale.

In some embodiment, the transfer of materials from a donor film is provided by laser induced forward transfer (LIFT), more preferably by blister-based laser induced forward transfer. The donor film is coated onto one side of a sacrificial layer on a transparent material (referred as transparent layer), wherein the layers are together forming a plate, are placed in close proximity to a receiver. Nanomaterial of the donor film is transferred from the donor film to the receiver to a particular spot when a laser pulse of adequate intensity is focused through the transparent layer onto an interface of sacrificial-donor films. Absorption of the laser energy in the sacrificial material, and forward transfer of at least part of the donor film typically occurs when ablation at the sacrificial-donor films interface provides safe transfer of the nanomaterial. In a preferred embodiment, the blister based (BB) LIFT aspect utilizes a femtosecond pulse at energy low enough to interact only with the interface of the sacrificial and transparent layers. In particular, intensity profile of the irradiation beam for (BB) LIFT can be selected from some of which include: Top-hat, Gaussian or doughnut-shaped intensity profile. This pulsed irradiation deforms the surface, causing a blister-like deformation of the sacrificial and transparent layers, which physically ejects the transfer material in a minimally spread direction. In line with this embodiment, a mechanism of the nanoparticle ejection from the sacrificial layer is known as a dynamic release layer. In blister based laser induced forward transfer, the dynamic release layer remains intact, whilst the surface material is ejected. Together with movable plate or receiver, the method according to the embodiments allows to create structure of nanomaterial on the receiver. The method can be provided in ambient atmosphere, which includes artificially chosen gas or vacuum condition; or under normal atmospheric condition. Simultaneous scanning of the plate or receiver improves adjusting of the orientation of the nanoparticles transferred and deposited on the receiver.

In another embodiment, the transfer of material can be provided by laser induced backward process. The laser induced backward transfer is known by the skilled person, for example from a non-patent document A. Logotheti, et al., Appl. Surf. Sci. 512 (2020) 145730 https://doi.org/10.1016/j.apsusc.2020.145730.

In another embodiment, the irradiation pulse can consist of two spatially overlapping pulses, with a temporal relationship. In this embodiment an initial pulse of variable duration from continuous to femtosecond will induce a physical change in the material to be transferred whilst. The second pulse of variable temporal or spatial profile can be used to transfer the now laser modified material. In one embodiment these pulses overlap in space, and their temporal profile can allow for overlap in which the second pulse can occur within the duration of the first pulse or distinct and time separated, where the material is left un-irradiated for a finite time.

Receiver, for example made of silicon, can be pre-patterned with nano-circuitry. This procedure of device fabrication is often thousands of grid-structured locations. Initial orientation and positioning of the nanomaterial must be achieved when the donor film is moved on the stages. The receiver can then be moved to pre-determined distances out of view to enable imaging of the donor film for orientation and positioning if necessary.

In some aspect, simultaneous detection can be provided by Raman spectroscopy or dynamic light scattering or fluorescence or photoluminescence imaging or preferably by high harmonic generation (HHG). The imaging laser induces high harmonic generation within many 2D materials. This can be used for extremely precise measurement. In some materials such as graphene, a skilled person can identify high harmonics generation and provide an information on number of deposited layers of nanomaterial and even to provide information on odd or even layers, provided subsequent data analysis is made. In most other materials, the HHG drops off 5 orders of magnitude as the material becomes successively thicker towards a bulk (20-30 layers). Furthermore, the intensity of this HHG varies with the orientation of the crystal with respect to the polarisation.

In some further aspect, a skilled person may choose material suitable for transfer techniques based upon laser induced forward transfer (LIFT) or blister based LIFT. Examples of such suitable materials may include, but are not limited to, metals (examples include Au, Ag, Pt, Pd, Cu, Ni, Cr, Ti, Fe, Zn, W, Si, and Al among others), metal alloys, metal compounds (examples comprise ZnO, $TiO_2$, Indium Tin Oxide, $MnTiO_3$, $CoAl_2O_4$ and CuO among others), inorganic dielectric materials (examples include $SiO_2$ and $Si_3N_4$ among others), graphene, transition metal dichalcogenides, hexagonal boron nitride, organic dielectric materials, inorganic semiconductor materials, organic semiconductor materials, polymers (examples include polystyrene, melamine resin, and PMMA-polymethylmethacrylate, among others), glasses, and ceramics.

In a preferred embodiment, the method comprises the step of imaging of the receiver by an imaging beam. The imaging beam allows simultaneous imaging of a chosen material on the irradiation plate, allowing in situ adjustment pre-transfer. In one embodiment, the imaging is accomplished with a broadband light source as opposed to the irradiation beam. In another embodiment, the imaging beam can generate high harmonic waves within nanomaterials forming the nanomaterial structure. The high harmonic wave coming from the nanomaterial is detected by a detector. More preferably, imaging laser beam causing HHG is a polarized laser beam. Adjusting the polarisation of the imaging laser beam helps to find the thickness and orientation of the films of deposited nanomaterial and re-orient the target to the specific angle requested. In a more preferred embodiment, the imaging system on the donor film side of the device is not utilized to define a position of the deposition on the receiver. Position selection is performed by recorded positioning via the translation stages.

In a preferred embodiment, the receiver is transparent for imaging laser beam which can scan the receiver and donor film at the same time. If the receiver is transparent, the donor can be scanned through the receiver, thus providing in situ measurement without any further mechanical operation of the stage for appropriate scanning of the nanomaterial structure. Simultaneous imaging of the receiver and donor film thus eliminates the need to move the receiver out of the way to identify a specific nanomaterial on the surface and the embodiment speeds up the method of production.

In a preferred embodiment, the step of simultaneous scanning is provided by imaging of the plate and/or receiver by a broadband light. More preferably, the broadband light is polarized. The broadband light source provides generalised identification. With the addition of narrow band filters, different properties of the 2D material can be observed. Polarised light and its orientation can improve detection of these atomically thin materials. In some embodiment, the illumination of the plate and/or receiver can be provided in parallel with another imaging, in particular with HHG imaging by the imaging laser beam.

In an embodiment, the broadband light, when reflected from the donor film or receiver, is passing through a band colour filter before the detection by the imaging detector. Colour filter can selectively transmits light of particular wavelength and/or polarization in order to achieve information on material composition of the nanomaterial structure, thickness of the nanomaterial structure.

In another aspect of the present invention, a device suitable for carrying the method according to the present invention is disclosed. The device comprises:

a source of an irradiation beam capable to focus the irradiation beam to a plate; wherein the plate comprising a transparent layer; a sacrificial layer on the transparent layer; and a donor film deposited on the sacrificial layer; and wherein the irradiation beam is configured to eject at least a part of the donor film;

means for moving the plate and/or receiver while the plate is irradiated by the first source; and means for simultaneous scanning of the receiver and/or donor film.

In a preferred embodiment, the means for simultaneous scanning of the receiver and/or donor film is an imaging laser capable to generate a high-harmonic wave within the material forming the nanomaterial structure; and wherein the device comprises a detector capable to detect high-harmonic wave coming from the nanomaterial structure. More preferably, the imaging laser is configured to emit polarized light.

In a preferred embodiment, the device further comprises at least one source of a broadband light capable to illuminate a plate and/or receiver. More preferably, the broadband light is configured to emit polarized light.

In a preferred embodiment, the device comprises at least two sources of broadband light, wherein the first source of broadband light is configured to illuminate a donor film; and a second source of broadband light is configured to illuminate the receiver.

In yet another embodiment, the device further comprises a first detector configured to detect reflected beam form the donor film. Alternately or together with this embodiment, the device may also comprise a second detector configured to detect reflected beam from the receiver or detect an emitted radiation from the receiver.

In yet another embodiment, the device comprises a colour filter positioned before the second detector so that the colour filter is capable to transmit particular wavelengths capable to provide an information on position of the part of the donor film on the receiver, material composition of the nanomaterial structure and/or thickness of the nanomaterial structure.

In another embodiment, the irradiation beam is configured to actuate the part of the donor film via blister based laser induced forward transfer.

DETAILED DESCRIPTION

Figure 1:
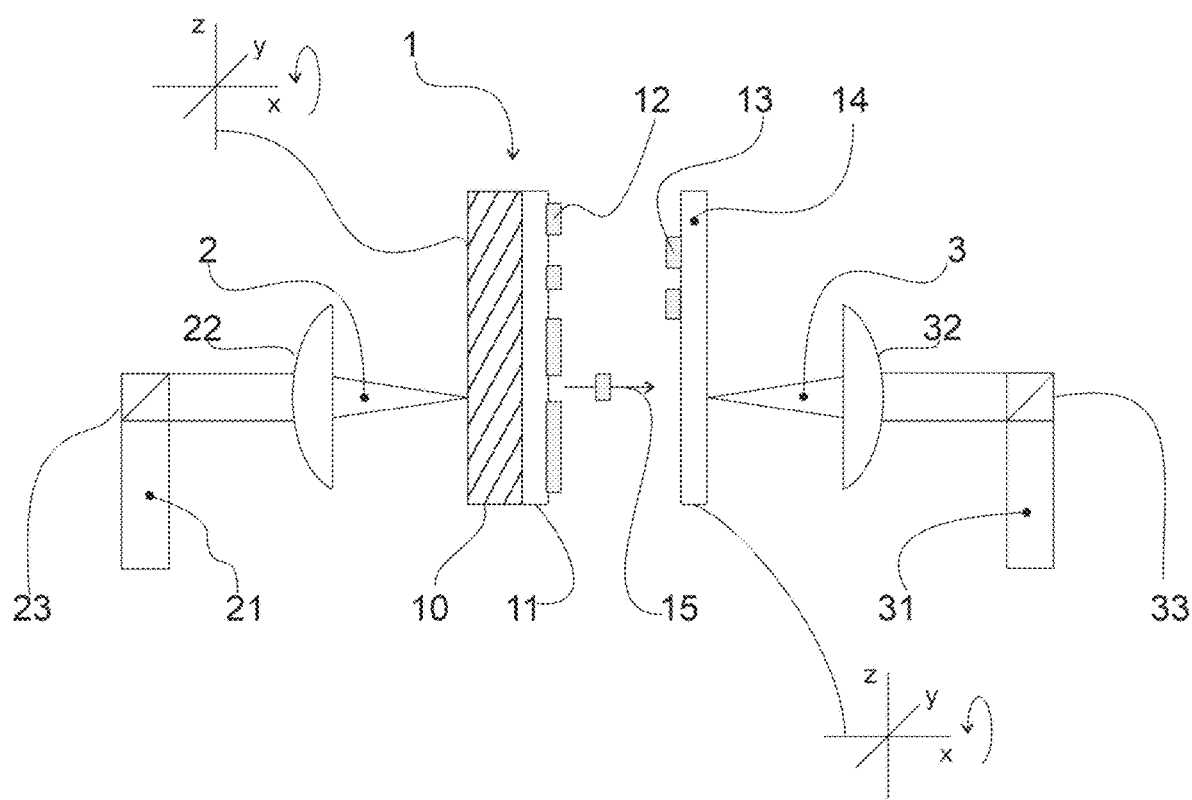
FIG. 1 represents a first embodiment according to the present invention.

Detailed embodiments disclosed hereinafter relates to transfer of nanomaterial via transfer process using a source 21 of irradiation beam 2, preferably laser induced forward transfer, more preferably blister based laser induced forward transfer. In some aspect, the source 21 of irradiation beam 2 can be a irradiation laser beam 2, e.g. pulsed laser beam, preferably femtosecond pulsed laser beam, configured so that the irradiation laser beam 2 can propagate through a transparent layer 10 and deposits its energy in the sacrificial layer 11 so that a part 15 of the donor film 12 is ejected and transferred to a receiver 14. In some aspect, the transfer can be forward, such as the above-mentioned laser induced forward transfer (LIFT) or blister-based LIFT or laser induced backward transfer.

In some aspect, the invention can be used for fabrication of micro and nanomaterial structure 13, diffractive optics manufacturing, waveguide fabrication, surface texturing, deposition of electrical conductors in various applications such as electrodes for microfluidic metallization and repair and tuning of electronic components.

A first embodiment of the present invention will be further explained with the reference to FIG. 1. FIG. 1 represents a schematic view of a device used in a method for production of nanomaterial structure 13 on a receiver 14. The device comprises a plate 1. The plate 1 is provided with a transparent layer 10 and a sacrificial layer 11 on top of the transparent layer 10. On the sacrificial layer 11, a donor film 12 is provided. The device, resp. method, when the sacrificial layer 11 is irradiated by an irradiation beam 2, allows to deposit energy and heats the interface of the sacrificial layer 11 and the transparent layer 10. Resulting melt-front propagates through the donor film 12 until it reaches the free surface and caused ejection of the donor film 12 to the opposite side of the plate 1, i.e. in forward direction with respect to laser irradiation. Nanomaterial of the donor film 12 is superheated beyond its boiling point until the resulting vapor-induced pressure at the interface catapults the molten donor film 12 toward the receiver 14. A part 15 of the donor film 12 is thus ejected via laser induced forward transfer (LIFT) and when deposited on the receiver 14, it forms a structure 13. Plurality of parts of structure 13 may form a pattern, e.g. pyramidal pattern or lines or individual single point arranged to an array, due to different position thereof. The position can be adjusted by means for moving, such as movable stage, capable to provide translation move in xyz direction and/or rotation and/or tilting. The means for moving can be installed on the plate 1 or a receiver 14 or both, the plate 1 and the receiver 14. The receiver 14 is positioned as a support of the part 15 of the in close proximity to the donor film 12. FIG. 1 further schematically discloses the receiver 14 being scanned by an imaging laser beam 3 configured to generate high harmonic wave in the nanomaterial. In some embodiment, the imaging laser beam 3 can be preferably generated by a separate laser system, which is different from a laser system generating the irradiation beam 2. In another embodiment, the imaging laser beam 3 and irradiation beam 2 can be both generated by the same laser system. In this embodiment, the laser beam generated by the same laser system is split into at least two branches and further adjusted in accordance with requirements for irradiation beam 2 and imaging beam 3. When using an imaging laser beam 3, associated means for measurement of non-linear optical properties, such as filters to block initial pump wavelengths, can detect second or third order of HHG emissions at the users discression, therefore, obtaining more information about the nanomaterial structure that can be revealed. It becomes possible to more clearly identify layer numbers, grain boundaries and orientations. In another embodiment, an imaging laser 3 with polarization control can generate nonlinear effects in the nanomaterial structure and thus can provide information about their orientation and layer number. The embodiment having polarized laser beam, in combination with the rotational control provided by the stages, enables a skilled person to adjust the nanomaterial structure to a chosen orientation with more ease and ability. If filters and polarization control optics are placed in front of the irradiation laser, these embodiments can also be used to check and confirm aspects on the receiver before transfer as well. A skilled person can optionally use simultaneous scanning of the receiver 14 and donor film 12 to get more information. This embodiments is particularly desired in optical layouts, which would enable adjusting the polarization of the imaging beam 3 and the irradiation beam 2 with one optical setup, thus providing a solution with no extra expense.

In another embodiment, the receiver 14 or donor film 12 can be scanned by Raman spectroscopy or irradiate by an excitation source 21 causing photoluminescence in the material or dynamical photon scattering. In the embodiment depicted in FIG. 1, the imaging beam 3 can pass through an imaging beam splitter 33 and imaging focusing means 32. At the same time with the LIFT, simultaneous above-mentioned scanning technique of the donor film 12 and/or receiver 14 is provided. Simultaneous scanning of the donor film 12 by Raman spectroscopy or photoluminescence or fluorescence or dynamical photon scattering helps material to be targeted to particular spot and the movable means, which can be a xy(z) stage. Scans across the receiver 14 provided with the xy(z) stage helps to find the position to a skilled person wishing to transfer the nanomaterial to the receiver 14 and adjust its orientation according to request. It further helps to align the nanomaterial to the target location and focus the irradiation beam 2 pulse causing ejection of the donor film 12 to the target area on the receiver 14. The method can be advantageously applied under atmospheric condition without need for a vacuum chamber.

In an embodiment of the invention, a donor film 12 made of nanomaterial to be transferred is deposited on sacrificial layer 11. Said sacrificial layer 11 can be titanium, copper, gold, aluminium, vanadium, chromium, tungsten, or Ge/Se alloy. The sacrificial layer 11 is deposited on top of the transparent layer 10, resp. substrate, e.g. made of glass, oxide compounds such as $Al_2O_3$ and $YBa_2Cu_3O_7$ high-temperature superconductors.

In another embodiment of the present invention, an irradiation beam 2 can be UV excimer emitting radiation at wavelength 193 nm with length of the pulse 15 ns. The irradiation beam 2 is focused by a first focusing means 22, e.g. a lens, to a plate 1, in particular to an interface of sacrificial-donor film 12 and configured to transfer Cu and Ag nanoparticle layers of thickness of the order of 1 μm on a transparent layer 10 made of fused-silica to a silicon receiver 14. The irradiation beam 2 can propagate through a first beam splitter 23. Gap between donor film 12 and receiver 14 is 10 μm. The energy density in each pulse is around 5 $J/cm^2$. The laser beam was configured to transfer the donor film 12 to a rectangular pattern. During irradiation, a receiver 14 was simultaneous scanned with an imaging laser beam 3. The scanning can be provided e.g. by HHG in nanomaterial deposited on the receiver 14. An imaging laser was focused on the receiver 14, in particular to a spot where the Ag or Cu nanoparticles should be deposited. A skilled person can use the means for scanning, in particular, such as an imaging laser beam 3, in combination with the angle adjustment aspects of the stage system to control the flatness of the donor and receiver. When the camera either is focused on the surface of the donor film 12 or receiver 14, adjustments in position x and y will shift the donor film 12 and receiver 14. Using the tilt control system of the stages, focus and these adjustments in x and y can be repeated. This enables control of the parallelness the donor and receiver and thus assists in their transfer. It also enables the independent movement in x and y with reduced risk of colliding the donor and receiver with each other. This also enables proximity adjustments that can bring the donor film 12 and receiver 14 very close to each other enabling higher accuracy of positioning and a change in the method of transfer, especially enabling stamping as described below.

A skilled person can adjust the pulse duration of the irradiation laser beam 2, in particular to femtosecond pulse beam, such as 100 fs pulsed irradiation laser beam 2, to change the formation mechanism to the blister base laser induced forward transfer (BB-LIFT) which can be preferably used to transfer 2D materials. When local heating of the sacrificial layer is used to form a blister via utilizing a longer pulse duration, the blister will retract to its initial position after transfer. If the donor film 12 and receiver 14 are in close enough proximity, BB-LIFT enables stamping of the material directly to the receiver 14 without having any transfer time through an atmosphere. The skilled person can further adjust the spatial profile of the irradiation pulse beam 2 to select a more specialized area of irradiation. A Gaussian profile will create a circular deposition with higher chance of transfer in the central region, whilst a top-hat pulse will allow for equal deposition from the entire region of irradiation. If this top-hat intensity profile is circular the deposition will be circular. If this intensity profile is rectangular the deposition will match the rectangular profile. This deposition profile will match other chosen beam profiles, which can be selected by the skilled person.

In yet another embodiment, a 500 fs pulsed laser irradiation beam 2 providing energy 100 mJ can be directed to a plate 1 comprising a donor film 12 made of Cu nanolayer. The laser pattern lines with width of 40 μm can be transferred to the receiver 14. Distance between donor film 12 and receiver 14 is preferably less than 50 μm. The receiver 14 can be scanned by polarized laser beam causing HHG. Due to the polarization of the imaging beam 3, it is possible to determine modes of phonons, in particular vibrational, rotational, and other low-frequency modes in a system of nanoparticles, thus number of layers. Due to synchronize imaging beam 3 and irradiation beam 2 of the donor film 12, it is possible to form a structure 13 of nanoparticle of pre-defined number of layers and shape.

In yet another embodiment a transparent substrate with a titanium used as sacrificial layer with CVD grown $MoS_2$- used as a donor film 12 deposited onto the titanium. A part 15 of the donor film 12 is intended to be deposited on a transparent receiver 14.

In order to achieve high homogeneity, randomly oriented grown $MoS_2$ must be transferred in such a way that it will be specifically oriented upon the receiver 14. Using the imaging beam 3 to create HHG within the $MoS_2$ will generate an image where varying intensity can define orientation, the donor film 12 can be accordingly rotated while it is simultaneously imaged. Once the required orientation is achieved, the $MoS_2$ can be deposited to a specific location. This is iterated for the size and scale of the $MoS_2$ coated and orientation aligned semi-saturable absorber for use as a laser medium.

In some embodiment, the simultaneous scanning of the donor film 12 or a receiver 14 can be provided by Raman spectroscopy. The Raman technique can be used to examine crystalline orientation, doping level, stress of the part 15 of the donor film 12 or part 15 of the donor film 12 deposited on the receiver 14. In another embodiment, the donor film 12 and/or receiver 14 can be scanned by dynamic light scattering or by photoluminescence or fluorescence spectroscopy. In yet another embodiment, simultaneous imaging such as an array of optical means such as Dark field, Bright field, DIC or polarization are suitable. Using of HHG or Raman is non-exhaustive list of simultaneous imaging using laser. A skilled person can also implement a laser confocal microscopy.

In another embodiment, an imaging laser beam 3 helps to form the corresponding pattern of the nanomaterial which may become deposited upon the face of the receiver 14. Said imaging laser beam 3 can be a laser beam 3 which creates high harmonic generation in a material. In particular, the imaging laser focuses a short-pulse, high-intensity laser beam 3 at a fundamental frequency onto a small spot being deposited at the receiver 14 on top of the nanomaterial structure. The small spot represents a place where a part 15 of a donor film 12 was transferred. Inside the transferred part 15, the imaging laser 3 generates a high harmonic signals HHG at a characteristic frequency. For example graphene, transition metal dichalcogenides ($MoSe_2$, $MoS_2$, $WS_2$, $WSe_2$ . . . ) can generate high harmonic signals and their characteristic frequencies are known by a skilled person. The high harmonic signals are subsequently collected and detected. The receiver 14 is scanned either by moving it in the x and/or y and/or z direction (i.e., along a line, and/or across a plane and/or throughout a volume) or the receiver 14 may rotate or tilt, whereas the imaging laser beam 3 is scanning its surface. The high harmonic signals from all scanned points are collected and electronically processed to produce the image.

In a preferred embodiment, the imaging laser beam 3 is polarized, more preferably, elliptically polarized. Due to the polarization of incoming light, interacting with the material in a way specific to a materials crystal structure. This will provide higher contrast, or adjust the incoming light in a fashion which is electronically detectable. In another embodiment, a sample of biological material is transferred from the plate 1 to the receiver 14 according to the above-mentioned LIFT process. The receiver 14 is positioned so that a scanning laser is capable to induce high harmonic generation in the deposited layer. More particularly, a biological sample on a glass receiver 14. The scanning laser beam is focused and letting the laser beam transmitting there through the glass receiver 14 to the biological sample. The laser beam performs a two-dimensional scanning operation on the sample to form a sectioned image of the sample. Alternatively, the scanning device comprises means for moving the sample to form two- or three-dimensional scanning operation. In the embodiment illustrated, the a source 31 of imaging laser beam 3 comprises a laser device that generates a laser beam that, after excited, induces imaging harmonic wave ($\lambda/2$) and third harmonic wave ($\lambda/3$). An example of the scanning laser source 31 can be a laser, having a pulse wavelength within the range of 1200-1350 nm. Within this range, the excitation spectrum of the laser beam issued by above-mentioned laser shows clear and distinct imaging and third harmonic waves in the range of visible light. It is noted that the laser beam does not cause autofluorescence, or little autofluorescence if any, on the sample within this wavelength range.

Figure 2:
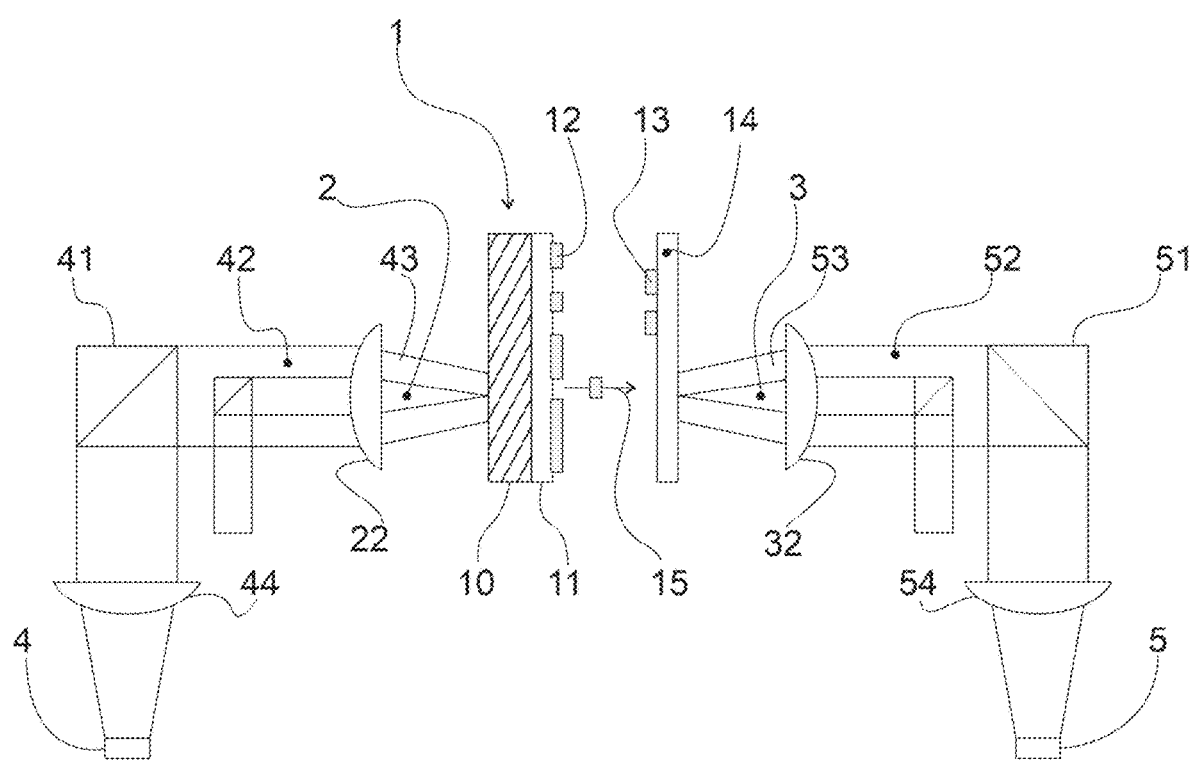
FIG. 2 represents a second embodiment according to the present invention.

FIG. 2 schematically represents a preferred embodiment of the present invention, wherein the device shown in FIG. 1 is adopted and provided with further features. In particular, FIG. 2 further discloses a first source 4 of broadband light. Such a source 4 can be flashlamp. Broadband light 42 is propagating through a third beam splitter 41 and can be advantageously focused at the beginning by a third focusing means 44. In certain moment, broadband light 42 and irradiation beam 2 are co-propagating and forms a first co-propagating beam 43. Narrow band filters positioned behind the first beam splitter 41 can be used to remove extraneous light of undesirable wavelengths. Nanomaterials structure are so thin that it is difficult to see them very easily. Therefore, a reflective silicon substrate is implemented which can have e.g. a 270 nm thick transparent oxide layer. A 2D material on top of the transparent layer has a different index of refraction compared to $Si_2$, and adds further distance for the light to travel. A part of the light will reflect off the top of the 2D material layer, a part of the light passes through and continues to the bulk, where it is reflected on the silicon. The reflected light on the silicon comes back to the observer and the different distances, which the light has travelled, causes an interference effect. In a preferred embodiment, a narrow band or broad band filters can implemented between a detector, which detect the reflected beam and observes an interference pattern, and the donor film 12. The narrow filter can be configured to increase the contrast from the interference effect.

FIG. 2 also shows an alternative embodiment, which comprises a source 5 of broadband light 52. In respect to the paragraph above, the light 52 can pass through a fourth beam splitter 51 and can be focused by a fourth focusing means 54. In certain moment, the broadband light 52 is co-propagating with the imaging beam 3 and forms an imaging co-propagating beams 53. The broadband light can be used to illuminate the receiver 14. Provided, the receiver 14 is transparent, the light 52 can illuminate a plate 1 and configure the stage so that, a part 15 of the donor film 12 can be deposited on particular spot on the receiver 14 and create a nanomaterial structure 13. The laser can be useful in adjusting the tilt of the stages to achieve high levels of parallelness.

In an advantageous embodiment, the embodiments using HHG for scanning can be implemented with an embodiment described in FIG. 2. FIG. 2 further represents a schematic drawing of a device, wherein a high harmonic signals, collected by collector lens, reaches a filter 8 (not shown in FIG. 4) where all background light of the fundamental frequency is filtered out. The filter allows transition only the pure high harmonic signal, which is received by a detector, e.g., a photomultiplier. The electronically produced image can be displayed on the screen of a computer. In advantageous embodiment, the high harmonic signal can be further process by a computer unit capable to control means for positioning so that, the means will be positioned at precise orientation.

Figure 3:
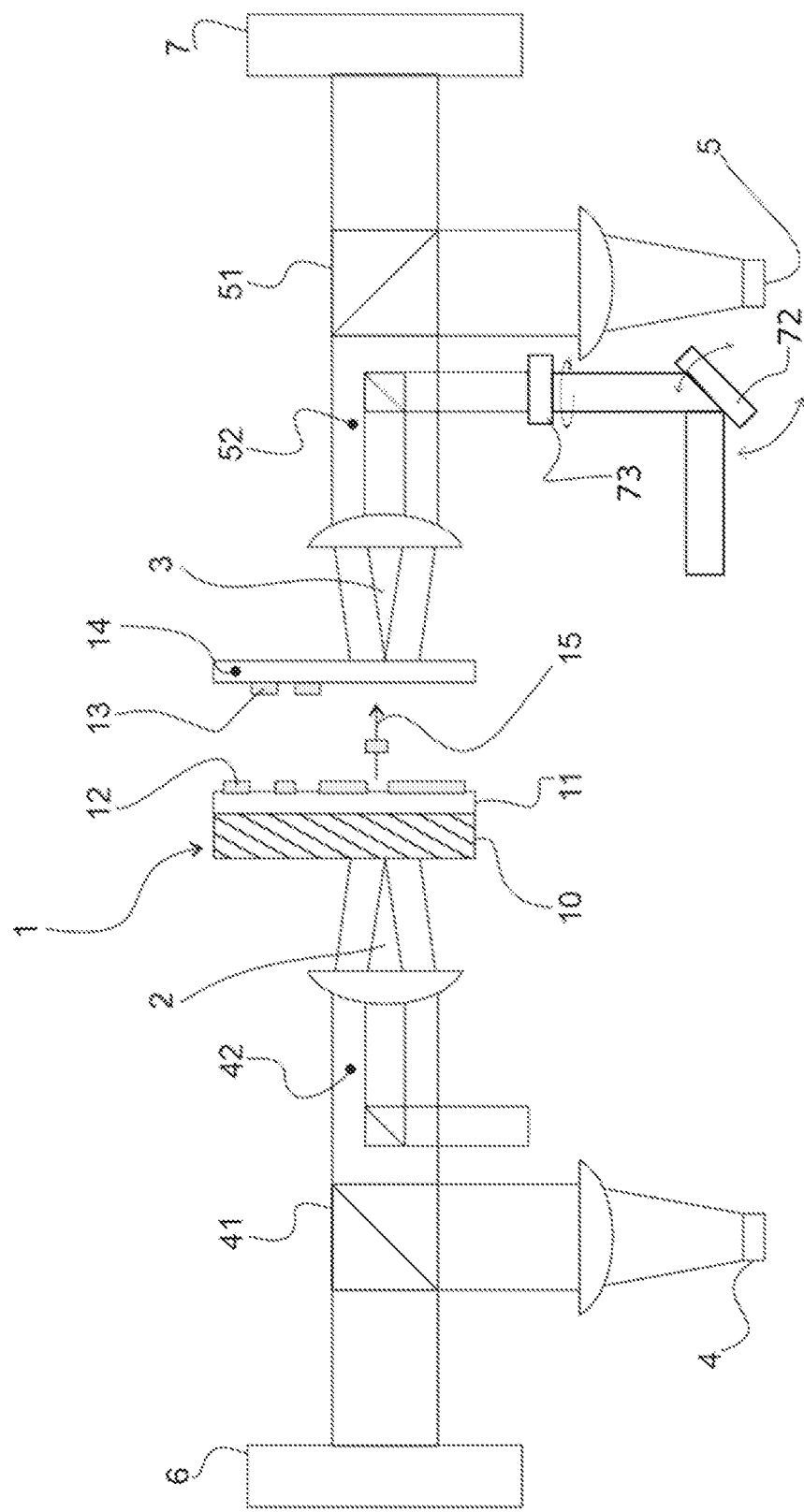
FIG. 3 represents a third embodiment according to the present invention.

FIG. 3 discloses a scheme of preferred embodiment comprising the embodiments schematically shown in FIG. 2. Embodiment on FIG. 3 further comprises a first detector 6 configured to detect lights reflected from the receiver 14 or plate 1. In alternative embodiment, an imaging detector 7 can be provided and being configured to detect lights reflected from the receiver 14 or plate 1. In advantageous embodiment, both of the detectors 6 and 7 are comprised therein.

Figure 4:
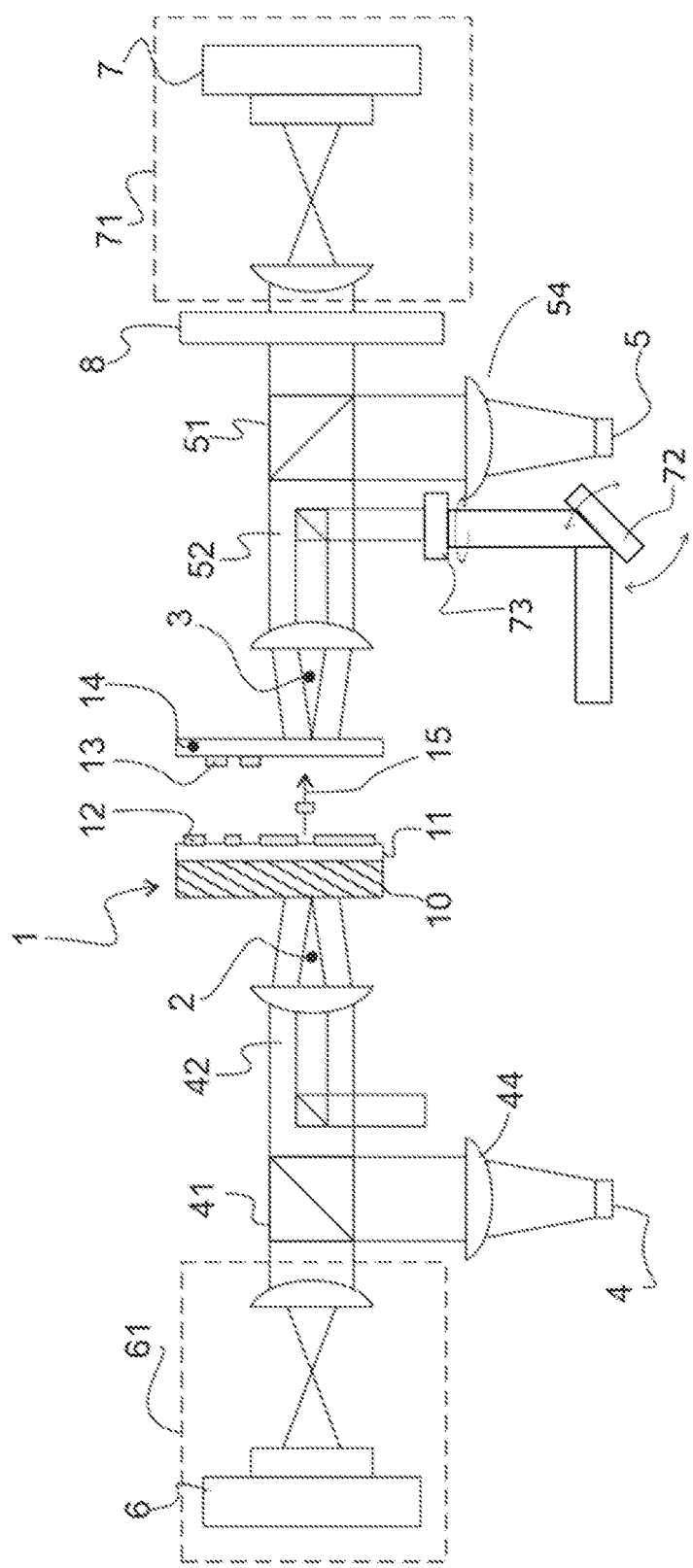
FIG. 4 represents a fourth embodiment according to the present invention.

FIG. 4 represents an embodiment, where the light illuminating the donor film 12 is reflected from and focused to a detector 6 by a first collimator 61. This provides a clearer image with even distribution of the light. FIG. 4 further represents an imaging collimator 71 and an imaging detector 7. Right side, i.e. with imaging beam 3, is further provided with a band colour filter 8 to separate e.g. HHG signals from background. The filter 8 allows to detect HHG generation signal while blocking the irradiation or imaging laser beams 2 or 3. Thus, thickness measurement in combination with a broadband source can be precisely obtained.

EXAMPLES

The following example will be explained in respect to an embodiment shown in FIG. 4, however, a skilled person, vis-à-vis the above mentioned embodiments, may adopt the teaching accordingly.

In order to generate blister based LIFT of with no cracks, an irradiation beam 2 which is represented by femtosecond laser pulses were focused through a 75 mm focal distance lens 32, after being cut to 2.5 mm in diameter by an aperture. The donor film 12 and the receiver 14 were mounted on an xy translation stage, with the donor film 12 placed about 55 mm from the lens 32.

In another example, a nanosecond irradiation laser pulses were focused through a 100 mm lens 22 after passing through a 2.5 mm aperture, and the donor film 12 was positioned about 115 mm away from the lens 22. An area of irradiation can be enlarged, when using nanosecond laser pulse, to ensure more homogeneous BB-LIFT. This approach spreads the energy over a wider region which reduces the change in fluence due to the change in pulse to pulse energy. The donor film 12 and receiver 14 mounted to each other and separated to a known distance of ~10 μm?200 μm. These were mounted to a tilt adjustable xyz translation stage. The pulse energies were varied within the range known to produce BB-LIFT. For the ns produced BB-LIFT this varied from 100 µJ where smooth non-cracked blisters were formed to 200 µJ per pulse where the blister would often crack and occasionally burst open. The energy values are particularly suitable for titanium sacrificial layer of thickness about 300 nm. For the fs produced blisters the pulse energies varied from 95 µJ to 150 µJ per pulse.

For both fs and ns embodiments, it was achieved the deposition of geometrically non-trivial pattern. The deposition method was simultaneous detected by anyone of the above-mentioned imaging technique. When the donor film 12 was irradiated by the pulse laser beam 2, a simultaneous imaging by a laser beam causing HHG signal generation was provided. Accordingly, a translation stage was adopted to particular spot to receive the part 15 of the donor film 12 to the spot on the receiver 14.

Figure 5:
FIG. 5 represents an experimental result obtained from AFM.
Figure 6:
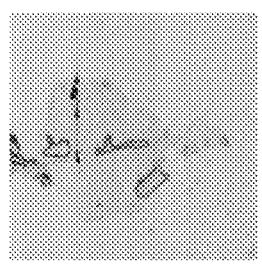
FIG. 6 represents the experimental result obtained from AFM.
Figure 7:
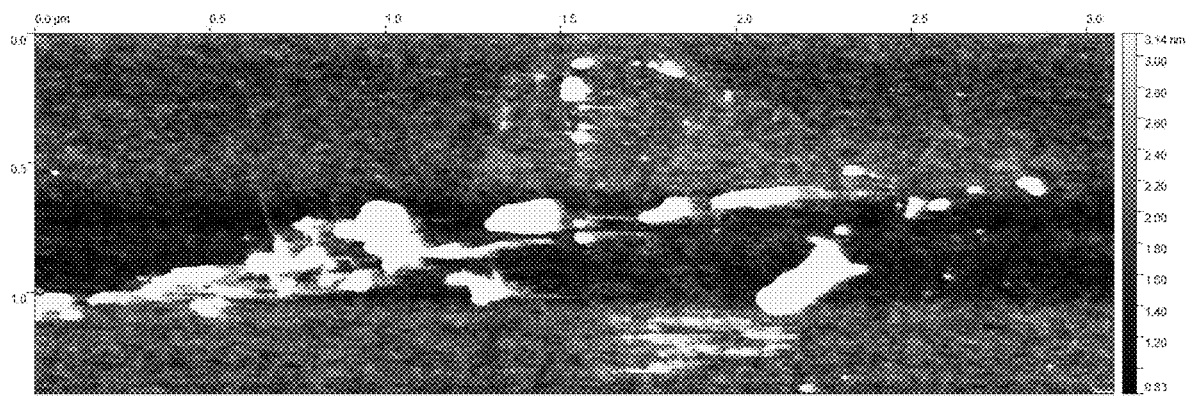
FIG. 7 represents the experimental result obtained from AFM.

Results shown in FIGS. 5, 6 and 7 by an AFM provides an image of a flake of 0.3 nm thick transferred hBN on an $SiO_2$/Si receiver 14, where the oxide layer was 270 nm. Further AFM images demonstrate a range of thicknesses of initially deposited and transferred hBN. From the combination of AFM, Raman, and optical imaging it can be gleaned that a large set of the transferred nanomaterials suffer no obvious degradation due to the BB LIFT process.

The AFM image shows a flake of hBN transferred via a fs laser pulse at close proximity to the receiver. A mask of a 2D material was drawn in Gwyddion and the height of this section was found to be 0.33 nm above the silicon surface suggesting that this flake is only one layer thick. It was also found that the RMS roughness of the material was 235 µm to the silicon's 230 µm, suggesting the material flattens to the surface it's been transferred to, similar to other flexible materials ejected by LIFT. The initial roughness of few-layer hBN on the titanium surface appears slightly smoother than the underlying Ti, with an RMS roughness of approximately 5 nm.

In another example, the receiver 14 and/or donor film 12 were scanned by a broadband light. To filter undesired signals coming from the beam reflected from the receiver 14 or the donor film 12, a filter 8 was used. In an example, graphene layer consists of 1-4 layers can be scanned by the broadband light and signal coming therefrom is propagating through a green filter (520-590 nm). Thickness of one layer of graphene shows contrast values of 0.077 as compared to 0.0114 through a blue filter (435-520 nm). This higher value enables ease of imaging. The higher initial contrast using the green filter allows contrast values of 0.077, 0.149, 0.216 and 0.278 for 1-4 layers respectively.

A mirror with automated axial tilt in X and Y is placed in the beam path of imaging laser before the optics. This Mirror enables subtle adjustment of the imaging laser path such that the movement of the laser can scan across the surface of either the donor or receiver.

An optic capable of re-orienting the polarisation of transmitted light, referred to as the waveplate is placed in the beam path of the imaging laser before focus. The use of the waveplate enables rotation of the polarization of the imaging beam to increase or decrease the HHG of the nanomaterial, determining its crystalline orientation or thickness without requirement to physically rotate the nanomaterial.

REFERENCE NUMBER LIST 1 a plate
10 a transparent layer
11 a sacrificial layer
12 a donor film
13 a nanomaterial structure
14 a receiver
15 a part of the donor film
2 an irradiation beam
21 a source of irradiation beam
22 first focusing means
23 a first beam splitter
3 an imaging beam
31 a source of imaging laser
32 imaging focusing means
33 an imaging beam splitter
4 a first source of broadband light
41 a third beam splitter
42 broadband light
43 first co-propagating beams
44 third focusing means
5 an imaging source of broadband light
51 a fourth beam splitter
52 broadband light
53 imaging co-propagating beams
54 a fourth focusing means
6 a first detector
61 a first collimator
7 an imaging detector
71 an imaging collimator
8 a band colour filter
72 a galvano mirror
73 A waveplate

What is claimed is:

1. A method for production of a nanoparticle layer on a receiver, wherein the method comprises:
    providing a plate comprising a transparent layer and a sacrificial layer on the transparent layer, wherein a donor film is deposited on the sacrificial layer;
    irradiating the sacrificial layer through the transparent layer by an irradiation beam so that a part of the donor film is transferred from the plate and received by the receiver;
    the receiver or the plate is moving so that the receiver is receiving at least a part the donor film at a pre-defined spot, wherein the plate and the donor film are relatively moving to each other or the donor film is relatively moving to the irradiation beam; and
    simultaneous scanning, by an imaging beam, of the receiver and the donor film, wherein the imaging beam is synchronized with the irradiation beam irradiating the sacrificial layer, wherein the imaging beam generates a harmonic wave within the nanoparticle layer, and wherein the harmonic wave comes from a nanomaterial structure that is detected, and wherein the receiver is transparent with respect to the wavelength of the imaging beam.

2. The method of claim 1, wherein scanning by the imaging beam is performed using polarized laser light.

3. The method of claim 1, wherein the receiver is transparent material and the imaging beam is scanning the receiver and the donor film at the same time.

4. The method of claim 1, wherein the simultaneous scanning is an imaging of the receiver by a broadband light, wherein the receiver is transparent for the respective wavelength of the broadband light.

5. The method of claim 4, wherein imaging the receiver by the broadband light is performed with a polarized broadband light.

6. The method of claim 4, wherein the broadband light is reflected from the receiver and passes through a band colour filter before detection by an imaging detector.

7. The method of claim 1, wherein assemblies of nanoparticles are transferred from the donor film to the receiver by a blister-based laser induced forward transfer.

* * * * *